(12) United States Patent
Loewen et al.

(10) Patent No.: US 11,107,594 B2
(45) Date of Patent: Aug. 31, 2021

(54) PASSIVE ELECTRICAL COMPONENT FOR SAFETY SYSTEM SHUTDOWN USING GAUSS' LAW

(71) Applicant: GE-Hitachi Nuclear Energy Americas LLC, Wilmington, NC (US)

(72) Inventors: Eric P. Loewen, Wilmington, NC (US); David W. Webber, Wilmington, NC (US); Seth Ryan Paul Strege, Wilmington, NC (US); Maria E. Pfeffer, Wilmington, NC (US); Scott L. Pfeffer, Wilmington, NC (US)

(73) Assignee: GE-Hitachi Nuclear Energy Americas LLC, Wilmington, NC (US)

( * ) Notice: Subject to any disclaimer, the term of this patent is extended or adjusted under 35 U.S.C. 154(b) by 276 days.

(21) Appl. No.: 16/176,407

(22) Filed: Oct. 31, 2018

(65) Prior Publication Data

US 2020/0135347 A1    Apr. 30, 2020

(51) Int. Cl.
| | |
|---|---|
| *G21C 9/02* | (2006.01) |
| *G01R 31/50* | (2020.01) |
| *G21C 9/027* | (2006.01) |
| *G21C 9/00* | (2006.01) |
| *H01H 59/00* | (2006.01) |
| *G21D 3/06* | (2006.01) |

(52) U.S. Cl.
CPC ............. *G21C 9/024* (2013.01); *G01R 31/50* (2020.01); *G21C 9/00* (2013.01); *G21C 9/027* (2013.01); *G21D 3/06* (2013.01); *H01H 59/00* (2013.01)

(58) Field of Classification Search
CPC . G21C 9/02; G21C 9/27; G21C 9/022; G21C 9/024; G21C 9/027; G21C 9/00; G21C 7/36; G21D 3/00; G21D 3/04; G21D 3/06; G21D 3/08; G01R 31/50; Y02E 30/00; Y02E 30/30; H01H 59/00
See application file for complete search history.

(56) References Cited

U.S. PATENT DOCUMENTS

| | | | | |
|---|---|---|---|---|
| 3,009,032 | A | * 11/1961 | Friend | ................ H01H 35/2607 |
| | | | | 200/83 N |
| 3,066,203 | A | * 11/1962 | Ovshinsky | ........... H01H 51/288 |
| | | | | 335/103 |
| 3,115,450 | A | 12/1963 | Schanz | |
| 3,660,231 | A | 5/1972 | Fox et al. | |

(Continued)

FOREIGN PATENT DOCUMENTS

WO    WO-2004019362 A1 *  3/2004   ......... H01H 59/0009

OTHER PUBLICATIONS

"DCIS Integration Tests for Lungmen Nuclear Power Plant"; Jiin-Ming Lin and Jeen-Yee Lee; Department of Nuclear Engineering, Taiwan Power Compoany; NPIC&HMIT 2017; Jun. 11-15, 2017; pp. 1962-1971.

*Primary Examiner* — Darlene M Ritchie
(74) *Attorney, Agent, or Firm* — Harness, Dickey & Pierce, P.L.C.

(57) ABSTRACT

An electro-technical device includes a first housing portion electrically isolated from a second housing portion with a point source being disposed within the first housing portion. A movable conductor is connected to the first portion and is responsive to an electric field generated by the point source to cause the movable conductor to contact the second housing portion to complete a circuit and send out a control signal.

5 Claims, 4 Drawing Sheets

(56) References Cited

U.S. PATENT DOCUMENTS

| | | | |
|---|---|---|---|
| 4,949,362 A | | 8/1990 | Gaubatz |
| 4,957,690 A | | 9/1990 | Fennern |
| 5,479,042 A | * | 12/1995 | James ................ H01H 59/0009 |
| | | | 257/415 |
| 6,034,339 A | * | 3/2000 | Pinholt .............. H01H 59/0009 |
| | | | 200/181 |
| 6,162,657 A | * | 12/2000 | Schiele ............... B81C 1/00936 |
| | | | 438/48 |
| 6,941,036 B2 | * | 9/2005 | Lucero ............... G02B 6/12004 |
| | | | 385/13 |
| 7,614,233 B2 | | 11/2009 | Chaki et al. |
| 7,728,703 B2 | * | 6/2010 | Kim ........................ H01P 1/127 |
| | | | 333/262 |
| 8,450,902 B2 | * | 5/2013 | Gulvin ............... H01H 59/0009 |
| | | | 310/309 |
| 10,129,975 B1 | * | 11/2018 | Tabor ..................... H05K 1/028 |

* cited by examiner

PASSIVE ELECTRICAL COMPONENT FOR SAFETY SYSTEM SHUTDOWN USING GAUSS' LAW

BACKGROUND

Field

The present disclosure relates to a safety system shutdown including a passive electrical component that senses a system parameter and becomes tripped if a predetermined set point is reached so that a signal is sent to take an action in the system. The passive electrical component makes use of Gauss' Law.

Description of Related Art

This section provides background information related to the present disclosure which is not necessarily prior art.

Modern nuclear reactors use a variety of digital systems for both control and safety, referred to as a Distributed Control and Information System (DCIS). These systems must be redundant, diverse, fault tolerant, and have extensive self-diagnosis while the system is in operation. Meanwhile, the nuclear digital industry is concerned with common cause software failure. Even more damaging is a cyberattack to, or through, the system safety systems. In the digital industry, the desire to increase computational power while decreasing component size results in a very small digital device with embedded software. It is very difficult to convince a regulatory body that these systems cannot have a common cause failure. Even more damaging operations can occur when this compact digital system is subjected to a cyberattack. These extreme unknown conditions of a nuclear power plant safety system lead to the cause for redundancy, independence, and determinacy, all of which contribute to significant added cost.

FIG. 6 schematically shows a conventional distributed control and information system (DCIS) 200 with both a safety portion 202 and non-safety portion 204 that are interfaced by a control panel 203. The present disclosure is directed to the safety portion 202 of the DCIS 200 which is shown in FIG. 7. The safety portion 202 of the DCIS 200 includes four independently designed divisions 202A-202D which each receive measured system signals that are collected and sent from a remote multiplexer unit RMU 205 which provides output to the digital trip module DTM 206 which each provide outputs to the trip logic units TLU 208 which each provide an output signal to the output logic unit OLU 210. The conventional safety portions 202 use a voting logic of at least 2 out of 4 of the different divisions 202A-202d receiving like signals in order to determine a fault (i.e. pressures and temperatures are not compared against each other). It becomes more difficult for the nuclear power plant control system designer, purchaser, installer, and operator to establish and trace the essential safety signals to ensure the system is performing as designed. A device and method are needed on a scale that humans can vary "signal flow" or "trace the flow of electrons/data so that the system is immune from cyber-attack.

SUMMARY

This section provides a general summary of the disclosure, and is not a comprehensive disclosure of its full scope or all of its features.

The present disclosure provides electro-technical devices that, coupled to control systems, can provide passive system safety shutdown or other emergency operation using Gauss' Law. These devices will solve the issue of common cause software failure or cyber security attacks that are inherent limitations of digital safety systems. The Gauss Law contactor provides an electro-technical device that can be set up to protect a nuclear power plant, or another sensitive infrastructure. The Gauss Law contactor of the present disclosure can be produced using metallic and plastic 3-D printing machines that can be utilized to ensure consistent manufacture of the device for which the manufacturing data can be captured and stored for utilization in confirming the devices consistent operational characteristics. The Gauss Law contactor uses a simple pass/fail or go/no-go check to convey to an electrical safety system to change state to safe shutdown. The printed device is placed into the safety system to perform 3 basic tasks: sense a system parameter (e.g. temperature, flow, pressure, power or rate of change), if the predetermined set point is reached—result in a "tripped" state, and lastly, if the safety system logic is met—send a signal to take an action in the system, such as shutdown. In the event of normal power supply loss, the Gauss Law contactor can either fail as is or fail in a safe state, depending on user requirements. The system prevents any loss of the safety function of the digital device due to power outage. The device also eliminates failures due to software or digital cyber attacks.

An electro-technical device according to the principles of the present disclosure includes a point source supplied with an input signal. A first housing portion is electrically isolated from a second housing portion with the point source being disposed within the first housing portion. A movable conductor is connected to the first portion and is responsive to an electric field generated by the point source to cause the movable conductor to contact the second housing portion to complete a circuit and send out a control signal.

According to a further aspect of the present disclosure, an electro-technical device is provided for detecting a fault state in a nuclear system. The electro-technical device includes a first housing portion electrically isolated from a second housing portion and a plurality of point sources being spaced from one another and disposed within the first housing portion, each of the point sources being supplied with an input signal. A movable conductor is connected to the first housing portion and is responsive to an electric filed generated by the plurality of point sources to contact the second portion to complete a circuit for sending out a control signal when at least two of the point sources receive an input signal indicative of a fault state.

According to a further aspect of the present disclosure, a method of making an electro-technical device includes digitally printing a first housing portion with a movable conductor connected to the first housing portion and a point source within the first housing portion and spaced from the movable conductor. Connecting the point source with an input signal. Digitally printing a second housing portion opposite to and electrically isolated from the first housing portion, wherein the movable conductor is responsive to an electric field generated by the point source to contact the second housing portion to complete a circuit and send out a control signal.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Figure 1:
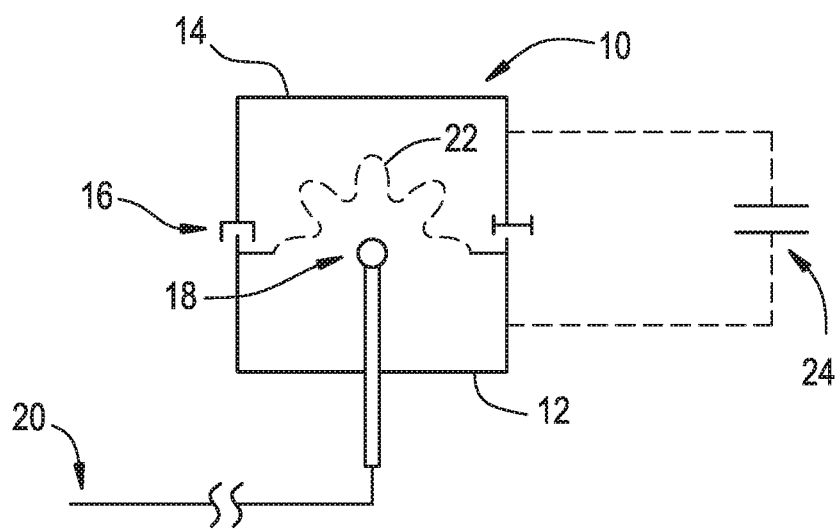
FIG. 1 is a schematic illustration of a Gauss law contactor according to the principles of the present disclosure shown in an open state.
Figure 2:
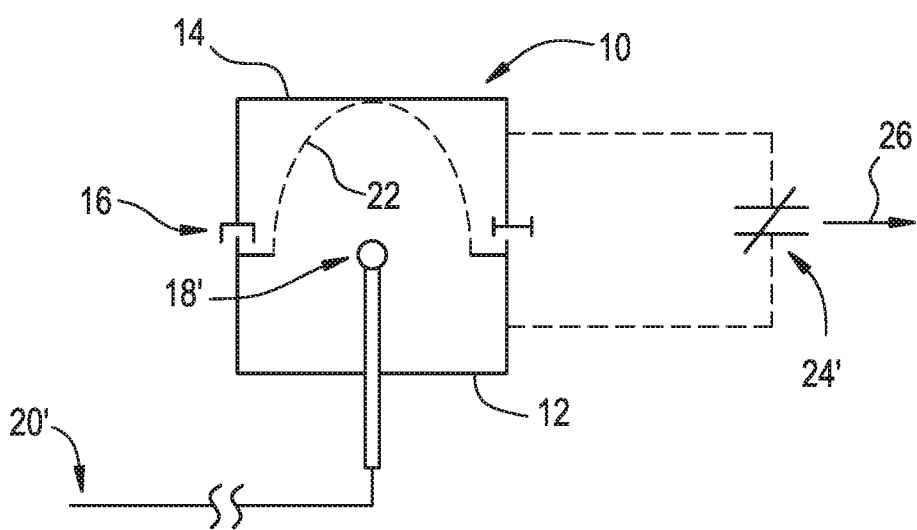
FIG. 2 is a schematic illustration of the Gauss law contactor shown in FIG. 1 shown in a closed state.

With reference to FIGS. 1 and 2, a Gauss Law contactor 10 according to the principles of the present disclosure will now be described. As shown in FIG. 1, the Gauss law contactor 10 includes a lower housing portion 12 and an upper housing portion 14 that are electrically separated from one another by an insulated joint 16. A point source 18 is connected to an input signal 20 and is disposed in the lower housing portion 12. A movable conductor 22 is connected to the lower housing portion 12 and is spaced from the point source 18. The electrical separation between the lower housing portion 12 and the upper housing portion 14 results in an open control circuit 24 for the Gauss Law contactor 10.

As shown in FIG. 2, the point source 18 is supplied with an increased input signal 20' indicative of an increased sensor voltage representing a safety condition. The safety condition can include an increase in temperature, pressure, fluid flow or other monitored condition. The increased input signal 20' results in an increased charge point source 18' which creates more divergence in the electrical field. The increased divergence of the electrical field around point source 18' causes the movable conductor 22 to move away from the charged point source 18' and into contact with the upper housing portion 14 of the Gauss Law contactor 10, resulting in the closing of the contactor 24'. The closed contactor 24' results in a safety control signal or action 26 to be taken. As an alternative, the reverse circuit can be set up to open (rather than close) the contactor 24 to de-energize a system for a protective feature.

Figure 3:
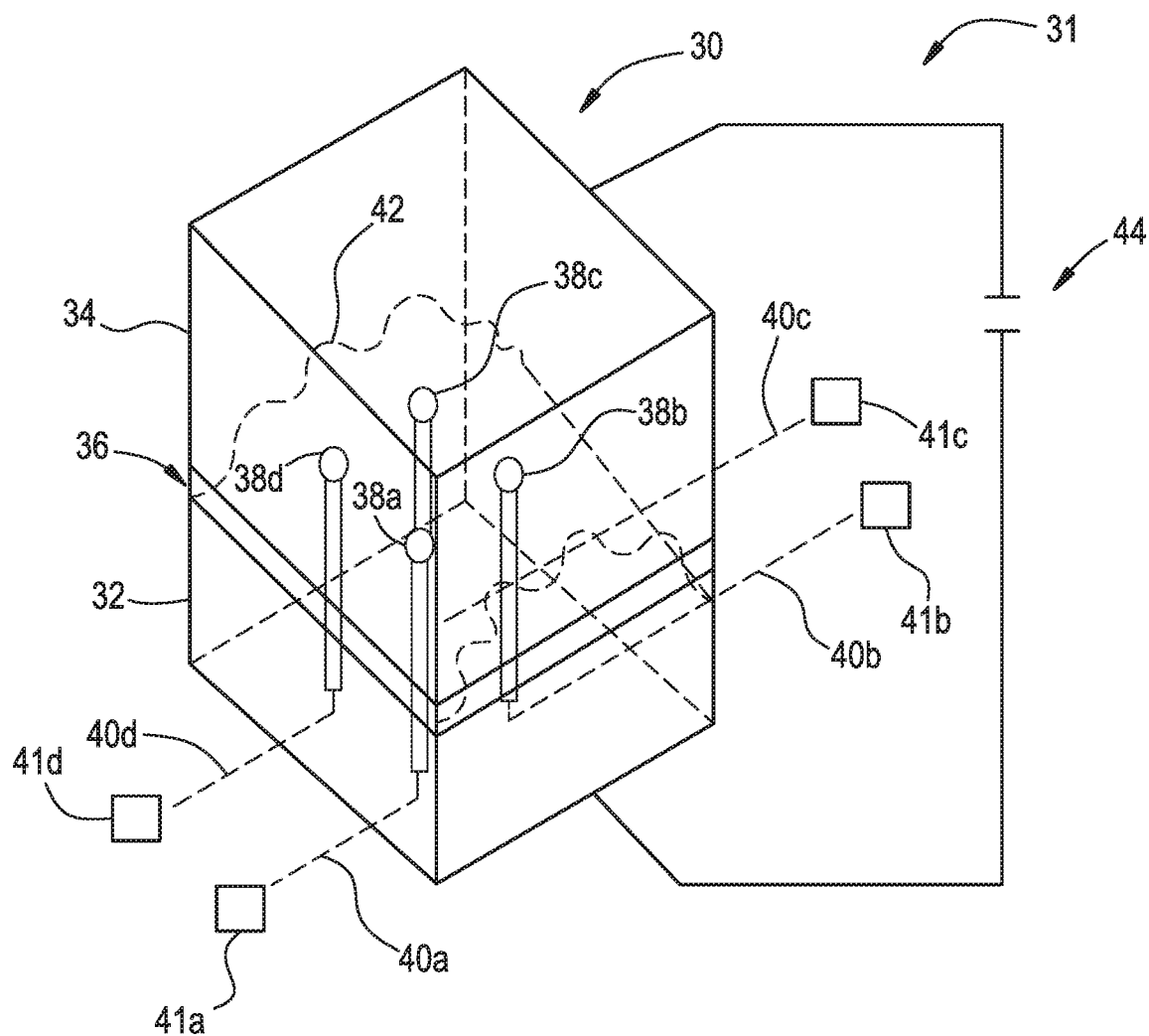
FIG. 3 is a schematic illustration of a gauss law contactor having four independent signals entering the Gauss logic contactor shown in an open state.
Figure 4:
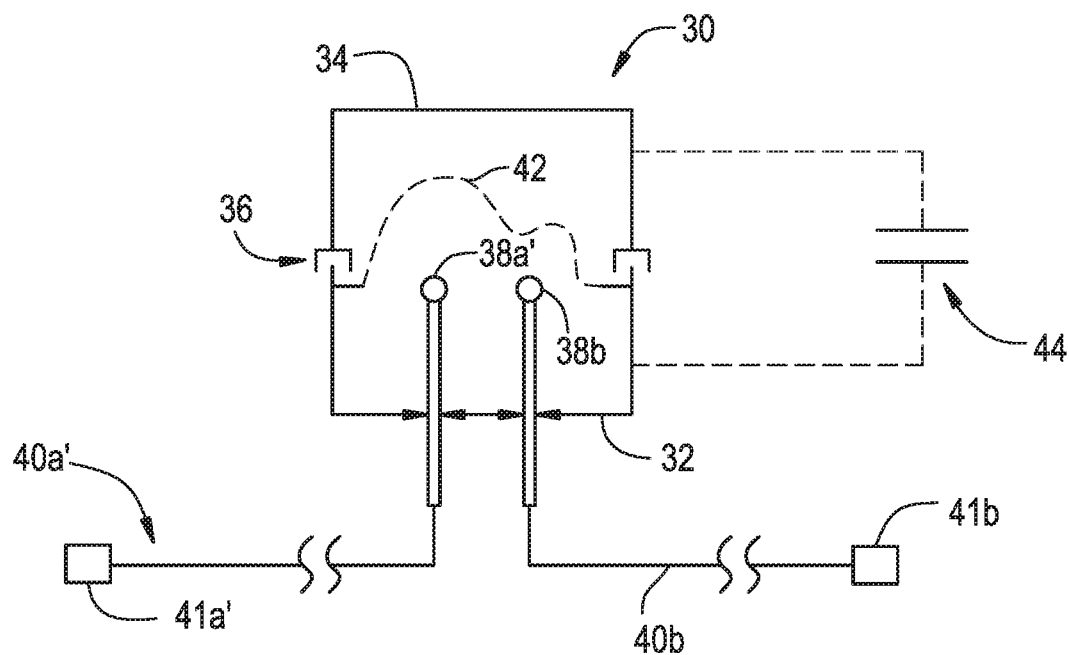
FIG. 4 is a schematic illustration of the Gauss law contactor shown in FIG. 3 with one input shown in a activated state.
Figure 5:
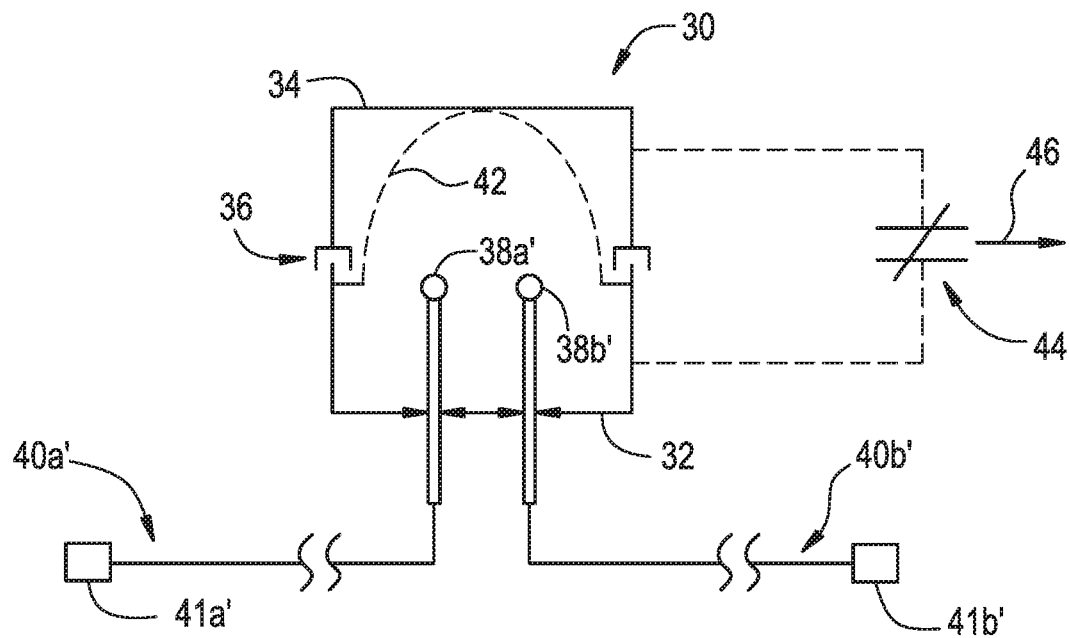
FIG. 5 is a schematic illustration of the Gauss law contactor shown in FIG. 3 with multiple inputs shown in a activated state for closing the contactor.

With reference to FIGS. 3-5, a Gauss Law contactor 30 is illustrated in a nuclear safety system 31 to provide a logic device without software. As shown in FIG. 3, the Gauss law contactor 30 includes a lower housing portion 32 and an upper housing portion 34 that are electrically separated from one another by an insulated joint 36. Four independent point sources 38a-38d are connected to separate input signals 40a-40d from sensors 41a-41d from the nuclear safety system 31 and are disposed in the lower housing portion 32. A movable conductor 42 is connected to the lower housing portion 32 and is spaced from the point sources 38a-38d. The electrical separation between the lower housing portion 32 and the upper housing portion 34 results in an open control circuit 44 for the Gauss Law contactor 30.

As shown in FIG. 4, one of the point sources 38a' is supplied with an increased input signal 40a' from the sensor 41a' of the nuclear safety system 31 indicative of a safety condition. The safety condition can include an increase in temperature, pressure, fluid flow or other monitored condition as detected by a sensor 41a-41d of the nuclear safety system 31. The increased input signal 40a' results in an increased charge point source 38a' which creates more divergence in the electrical field. The increased divergence of the electrical field around point source 38a' causes the movable conductor 42 to move away from the charged point source 38a' which however, is insufficient to cause the movable conductor 42 to contact with the upper housing portion 34 of the Gauss contactor 30 so that the control circuit 44 remains open.

Figure 6:
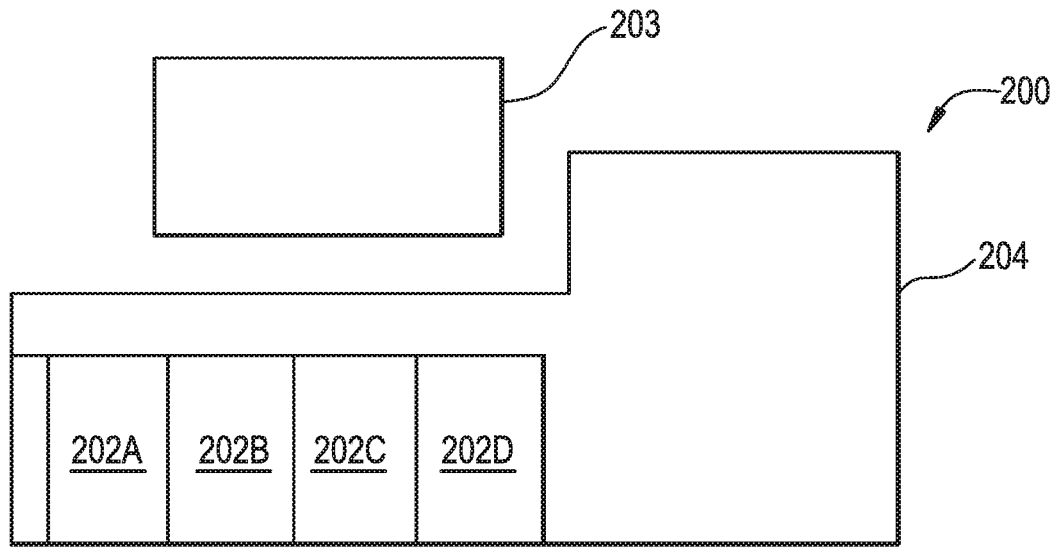
FIG. 6 is a schematic view of a conventional digital system of a distributed control and information system for a nuclear reactor.
Figure 7:
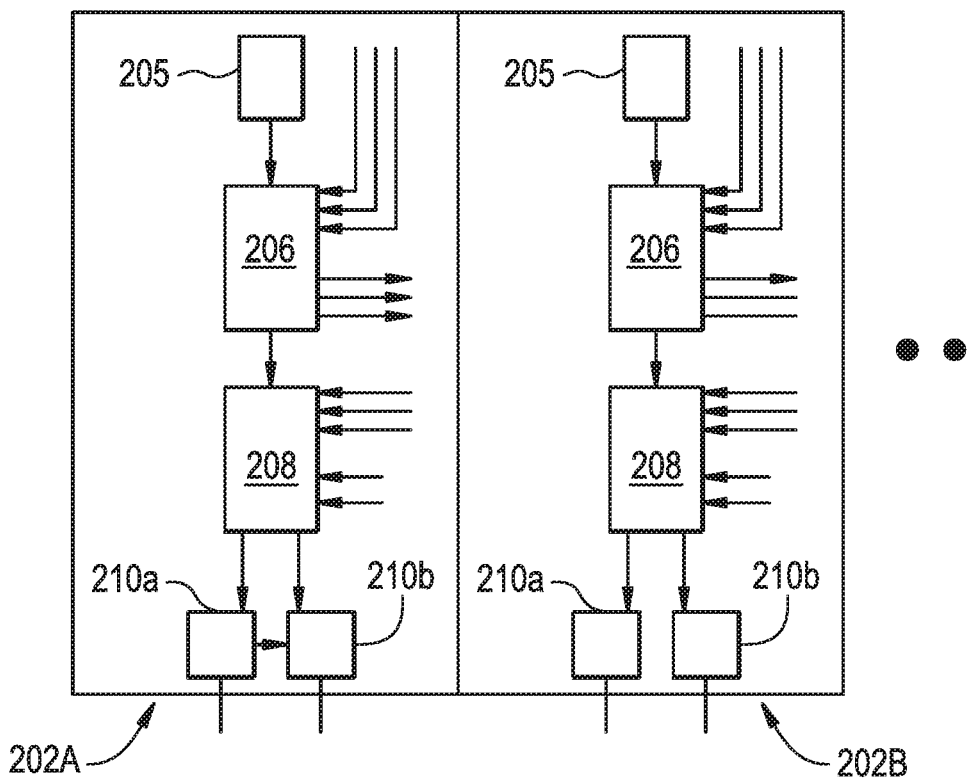
FIG. 7 is a schematic view of a safety portion of the conventional digital system of a distributed control and information system as shown in FIG. 6.

As shown in FIG. 5, multiple ones of the point sources 38a', 38b' are supplied with an increased input signal 40a', 40b' each indicative of a safety condition. The increased input signals 40a', 40b' result in an increased charge point source 38a' and 38b' which creates more divergence in the electrical field. The increased divergence of the electrical field around point sources 38a' and 38b' cause the movable conductor 42 to move away from the charged point sources 38a' and 38b' and into contact with the upper portion 34 of the Gauss Law contactor 30, resulting in the closing of the control circuit 44' to provide a safety control signal 46 to be sent so that a shutdown action or other security operation can be performed. As an alternative, the reverse circuit can be set up to open (rather than close) the contactor 24 to deenergize a system for a protective feature. The Gauss Law contactor 30 can replace the digital trip module DTM 206, trip logic unit TLU 208, and the output logic unit OLU 210 previously described in prior art FIGS. 6 and 7.

The Gauss Law contactor 10/30 can be manufactured by digital printing some or all of the components to insure consistent operation and response. By way of example, the upper and lower housings 12, 14/32, 34, the point sources 18/38a-38d and the movable conductor 22/42 can all be made by digital printing from the same or different materials. The movable conductor 22/42 can be formed as a thin metal film and can include folds, undulations or a bellows shape to allow for uninhibited movement in response to an increased electrical field emanating from the point sources 18/38a-38d.

Digital printing results in highly accurate and consistent production of component parts and can have a digital record for the accurate manufacture of each component. The digital record can be utilized to certify the accurate production of the Gauss Law contactor 10/30.

The present disclosure envisions the use of the Gauss Law contactor provided in this application according to the following operating modes. During steady-state operation of the Gauss Law contactor 10/30, a baseline voltage can be supplied to the contactor. If the voltage to the device 10 or two out of four voltages for the device 30 exceeds the device baseline, the circuit 24/44 is closed and a safety system response 26/46 is actuated. For some devices the response is a once-in-a-lifetime component accusation, (the fuse) whereas some of the embodiments described can be physically reset by the operator.

If there is a loss of primary power, and uninterruptible power supplies used to maintain a constant voltage level within the circuitry. The electricity from this secondary supply will also be fed to the safety measuring devices, and the loss results in the safe shutdown of the system. In the event of a loss of all power, then the system either fails as is or to a safety state, depending on how the device is placed into an architecture by the circuit designer.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An electro-technical device, comprising:
   a point source supplied with an input signal;
   a first portion electrically isolated from a second portion, the point source including an elongated element extending through and disposed within the first portion, the elongated element extending away from the first portion and toward the second portion; and
   a movable metallic film conductor fixedly connected to the first portion and being responsive to an electric field generated by the point source to move away from the point source and contact the second portion to complete a circuit and send out a control signal.

2. The electro-technical device according to claim 1, wherein the input signal is representative of one of a signal from a temperature sensor, a pressure sensor or a flow sensor.

3. A method of making an electro-technical device, comprising:
   forming a first housing portion;
   fixedly connecting a movable metallic film conductor to the first housing portion;
   inserting a point source including an elongated element extending through and into the first housing portion at a fixed location and spaced from the movable conductor, the elongated element extending away from the first portion, the point source being supplied with an input signal;
   providing a second housing portion opposite to and electrically isolated from the first housing portion, wherein the movable conductor is responsive to an electric field generated by the point source to move away from the point source and contact the second portion to complete a circuit and send out a control signal.

4. The method according to claim 3, wherein the input signal is representative of one of a signal from a temperature sensor, a pressure sensor or a flow sensor.

5. The method according to claim 3, wherein the first housing portion, the second housing portion and the movable conductor are made from metal by 3-D digital printing.

* * * * *